United States Patent [19]
Au et al.

[11] Patent Number: 5,684,738
[45] Date of Patent: Nov. 4, 1997

[54] ANALOG SEMICONDUCTOR MEMORY DEVICE HAVING MULTIPLE-VALUED COMPARATORS AND FLOATING-GATE TRANSISTOR

[75] Inventors: Rita Au, Miyagi-ken; Tadashi Shibata, 5-2, Nihondaira, Taihaku-ku; Tadahiro Ohmi, 1-17-301, Komegabukuro 2-chome, Aoba-ku, both of Sendai-shi Miyagi-ken 980, all of Japan

[73] Assignees: Tadashi Shibata; Tadahiro Ohmi, both of Miyagi-ken, Japan

[21] Appl. No.: 507,289

[22] PCT Filed: Jan. 20, 1994

[86] PCT No.: PCT/JP94/00073

§ 371 Date: Nov. 9, 1995

§ 102(e) Date: Nov. 9, 1995

[87] PCT Pub. No.: WO95/20268

PCT Pub. Date: Jul. 27, 1995

[51] Int. Cl.[6] .............................. G11C 16/00; H03M 1/12
[52] U.S. Cl. ..................... 365/185.03; 365/45; 341/136; 341/159
[58] Field of Search ............... 365/185.03, 45, 365/168; 341/133, 136, 159

[56] References Cited

U.S. PATENT DOCUMENTS

| H1035 | 3/1992 | Haviland et al. | 365/45 |
| 5,192,879 | 3/1993 | Aoki et al. | 326/87 |
| 5,376,935 | 12/1994 | Seligson | 341/136 |

FOREIGN PATENT DOCUMENTS

222749  5/1985  Germany.

*Primary Examiner*—David C. Nelms
*Assistant Examiner*—Andrew Q. Tran
*Attorney, Agent, or Firm*—Marshall, O'Toole, Gerstein, Murray & Borun

[57] ABSTRACT

A semiconductor memory circuit which realizes a source follower having a voltage gain equal to one, a decrease in the time necessary for the source follower to reach its full output voltage. Furthermore, the multiple-valued or analog output voltage can be easily converted to a binary-digital form with this memory circuit. This semiconductor circuit comprises at least an MOS transistor. A multiple-valued or analog data line is connected to the inputs of multiple-valued comparators, the outputs of said comparators are coupled capacitively to the input gate of a source-follower circuit, and the output of said source-follower circuit is fed back to the data line.

12 Claims, 5 Drawing Sheets

Figure 3
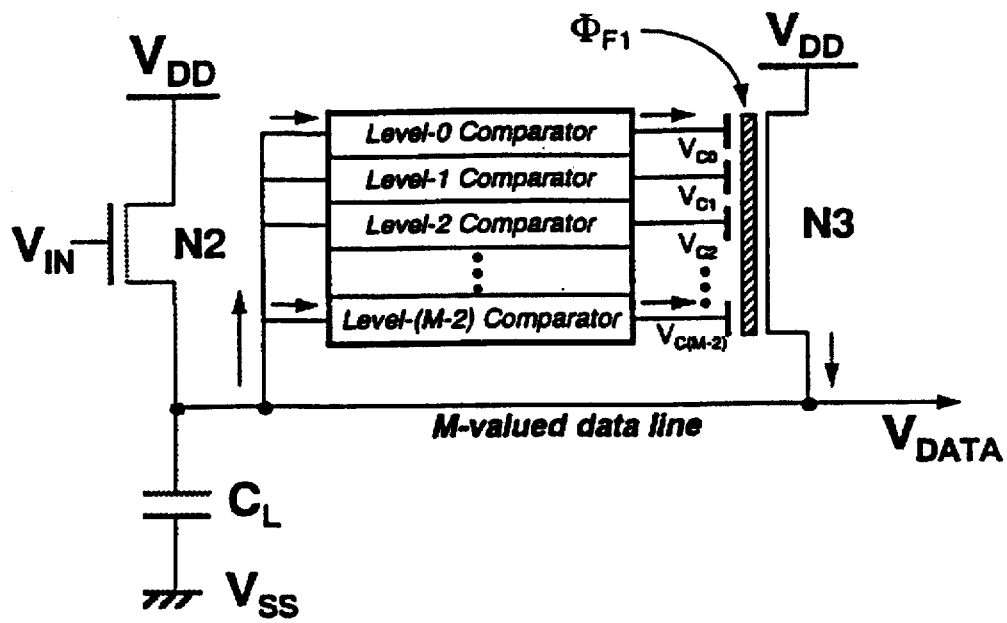
Figure 4 (Bitline capacitance = 1 pF)
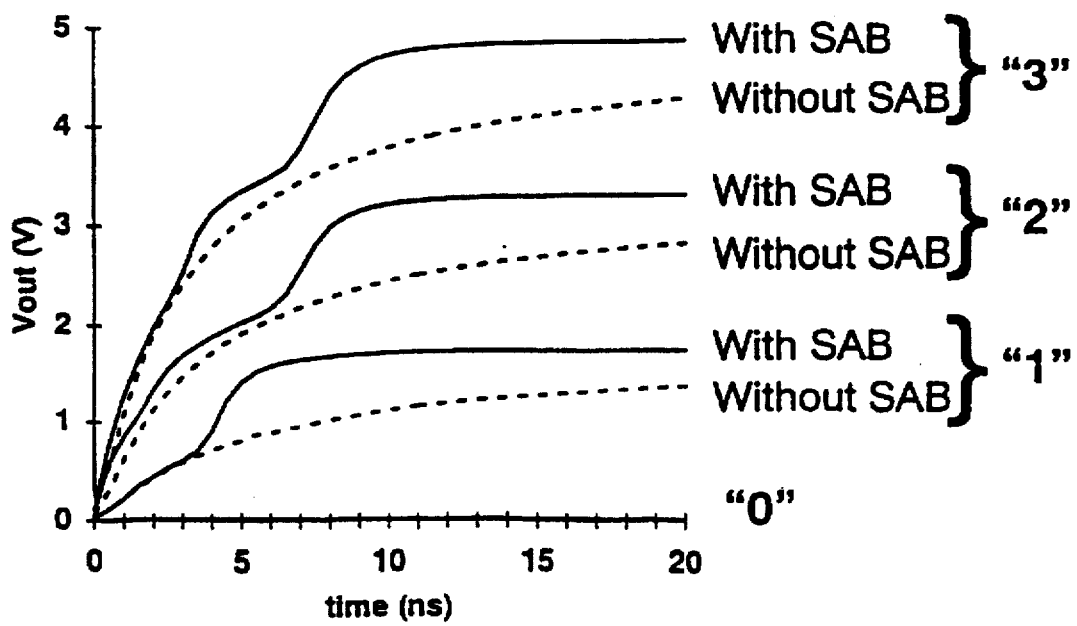

ANALOG SEMICONDUCTOR MEMORY DEVICE HAVING MULTIPLE-VALUED COMPARATORS AND FLOATING-GATE TRANSISTOR

TECHNICAL FIELD

The present invention relates to a semiconductor device, and in particular to a high-performance CMOS circuit.

BACKGROUND ART

Source-follower circuits are frequently used to drive impedance loads, especially in applications employing analog or multiple-valued signals. Such a circuit is depicted in FIG. 1. This diagram indicates a source-follower circuit comprised of one NMOS transistor (abbreviated as "NMOS") (N1) and a load capacitance ($C_L$); when N1 is turned on, the current $I_D$ increases $V_{OUT}$ until $$V_{OUT} = V_{IN} - V_T, \qquad (1)$$

where $V_T$ is the threshold voltage of the NMOS. $V_T$ is given by:

$$V_T = V_{T0} + \gamma(\sqrt{2\phi_F + |V_{SB}|} - \sqrt{2\phi_F}), \qquad (2)$$

where $\gamma$ is the body effect coefficient, $V_{SB}$ is the differential source-body voltage, and $\phi F$ is defined by:

$$\phi_F = \frac{|E_f - E_i|}{q}. \qquad (3)$$

$E_f$ is the Fermi level of the semiconductor, $E_i$ is the intrinsic Fermi level, and q is the charge of an electron.

A problem of this circuit arises if the output voltage is desired to be equal to the input voltage. In the case of a source-follower circuit, if the body of the NMOS is biased at 0 V, then $V_{SB}$ will increase as the output voltage rises. This will cause $V_T$ to rise, even if $V_{T0}=0$ V. This phenomenon is called the "body effect". Therefore, $V_{OUT}$ is always less than $V_{IN}$ for a source follower containing an enhancement-mode NMOS.

Another drawback of the source-follower circuit is its slow transient characteristics. As $V_{OUT}$ rises, the transistor's gate-source differential voltage $V_{GS}$ ($=V_{IN}-V_{OUT}$) decreases, causing a reduction in the channel conductivity, which in turn reduces the drain current $I_D$. Therefore, the amount of current available to pull up $V_{OUT}$ continuously decreases. This results in the transient characteristics shown in FIG. 2.

The present invention was created in order to solve the problems stated above; it has as an objective thereof to provide a semiconductor device which makes possible the full restoration of the source-follower output to equal its input voltage, and also decreases the time required for the output to reach its maximum value. In addition, this invention can also be used to convert the analog output of a source-follower circuit into a digital form.

DISCLOSURE OF THE INVENTION

The present invention discloses a semiconductor circuit comprising at least an MOS transistor. A multiple-valued data line, which is capable of M discrete voltage levels, or an analog data line rises (or falls) from an initial voltage to its final voltage. The inputs of M−1 comparators are connected to said data line, the outputs of said comparators are coupled capacitively to the input gate of a source-follower circuit, and the output of said source-follower circuit is fedback to the data line.

By means of the above semiconductor circuit, the time necessary for the data line to reach its final voltage is drastically reduced. Furthermore, the voltage of the data line can be easily converted to a binary-digital form with this circuit.

BRIEF DESCRIPTION OF THE DRAWINGS

FIG. 3 is a conceptual diagram showing the circuit of Embodiment 1.

FIG. 4 is a graph showing the simulation data of the circuit of Embodiment 1. In FIG. 4 SAB is sence and boost.

BEST MODE FOR CARRYING OUT THE INVENTION

Figure 1:
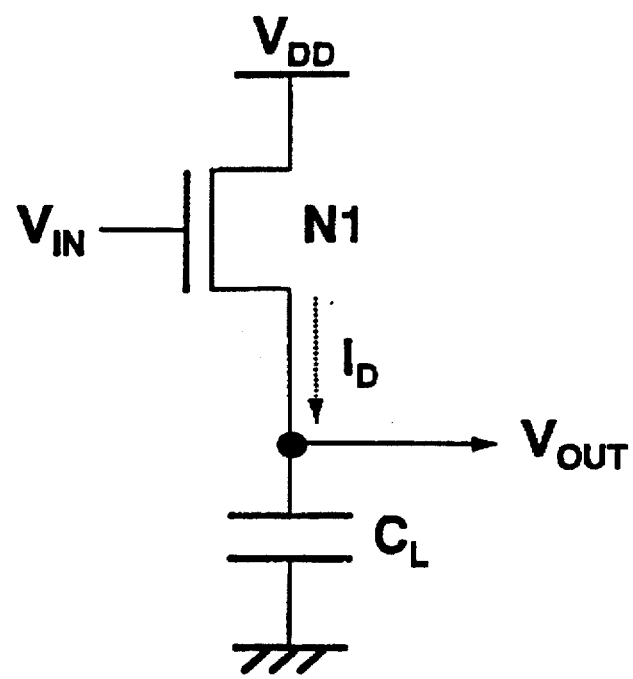
FIG. 1 is a conceptual diagram showing a typical NMOS source-follower circuit.
Figure 2:
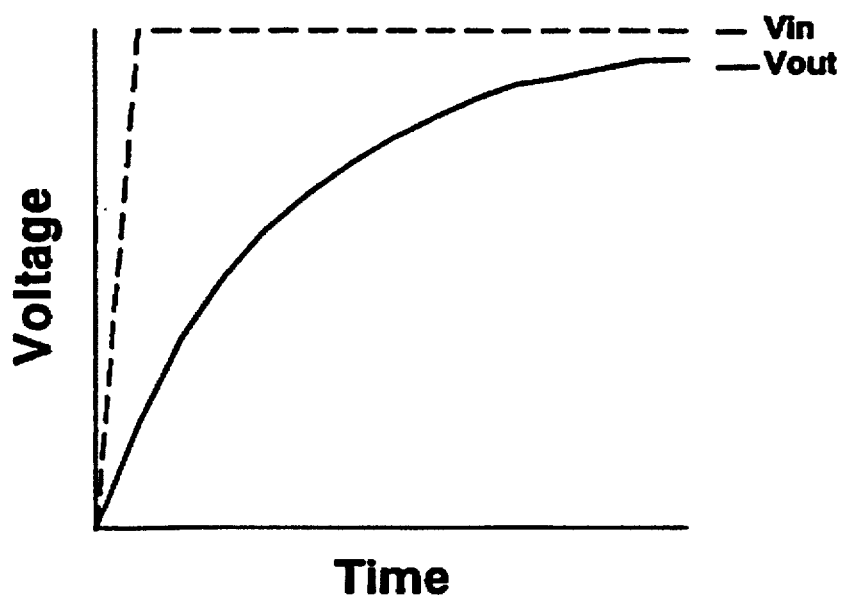
FIG. 2 is a graph showing time dependence of the output voltage of an NMOS source follower.

Herein below, the present invention will be explained in detail based on embodiments; however, the present invention is of course not limited to these embodiments.

(Embodiment 1)

This invention is used in a multiple-valued system containing M voltage levels. The lowest voltage level (Level 0) is determined to be equal to $V_{SS}$, and the highest voltage level (Level M−1) is determined to be equal to $V_{DD}$, where $V_{DD}$ and $V_{SS}$ are both power supplies to the system, and $V_{DD}$ is a higher voltage than $V_{SS}$. In general, the voltage corresponding to Level x is $$V_{Level\,x} = \left(\frac{V_{DD} - V_{SS}}{M-1}\right) \cdot x + V_{SS} \qquad (4)$$

The first embodiment of the present invention is shown in FIG. 3. In the diagram, an M-valued data line, which is the output of an NMOS source-follower circuit (N2), is connected to the inputs of M−1 analog comparators. The outputs of these comparators are capacitively coupled to the floating gate of a large NMOS (N3). The drain of N3 is connected to $V_{DD}$, the source of N3 is connected to the M-valued data line, and the body of N3 is connected to $V_{SS}$. N3 is designed to be much larger than N2.

In this circuit, the comparators simultaneously compare the voltage of the M-valued data line ($V_{DATA}$) to the voltages corresponding to Level 0 through Level M−2. If $V_{DATA}$ rises beyond $V_{Level\,0}$, then the Level-0 comparator output will become $V_{DD}$. If $V_{DATA}$ continues to increase above $V_{Level\,1}$, then the Level-1 comparator output will also become $V_{DD}$, and so forth. As the comparators turn on one by one, the potential ($\Phi_{F1}$) of the floating gate of N3 increases. Since the comparator outputs ($V_{C0}$, $V_{C1}$, $V_{C2}$, ..., $V_{C(M-2)}$) have equal coupling capacitances to the floating gate, and said coupling capacitances are designed to be much larger than the coupling capacitance from the floating gate to the body of N3, $\Phi_{F1}$ is given by the following equation:

$$\Phi_{F1} = \frac{V_{C0} + V_{C1} + V_{C2} + \ldots + V_{C(M-2)}}{M-1} \quad (5)$$

Since N3 is also in a source-follower configuration, $V_{DATA}$ will rise until it equals $\Phi_{F1} - V_{TN3}$.

The function of this invention is to continuously detect the present level of $V_{DATA}$ and then boost it to the next higher level. It continues the cycle of detecting and boosting until current has stopped flowing from N2 (i.e., until N2 is cut-off). In this manner, the capacitance load on the data line is primarily pulled up by the large current flowing from N3. Therefore, the data readout from the source follower of N2 is drastically accelerated, and the problem of slow source-follower circuit operation has been resolved.

In the present invention, the body effect factor $\gamma$ can be reduced by connecting the body of N3 to a voltage source lower than $V_{SS}$; that is, a negative substrate bias may be applied to the p-type substrate. Furthermore, if the body of N3 were an isolated well connected to the data line, then the second term in Eq. 2 would equal 0. Such isolation can be realized by forming p-wells in an n-type substrate for each N3 transistor, or by using a silicon-on-insulator substrate. The elimination of the body effect in this manner would make the gain of this circuit equal to one. In this case, $V_{DATA}$ would rise until it equals $\Phi_{F1}$.

In this embodiment, the coupling capacitances of the comparator outputs to the floating gate of N3 were all made equal. However, they can be designed to have different values, and the effective gain of the N3 source follower can be modified if necessary.

This invention may be used in an analog system if the voltages of the analog data line could be classified into M discrete levels.

Furthermore, the outputs of the comparators are in digital form, thus providing a means to simply convert the multiple-valued or analog signal into a digital signal.

FIG. 4 displays the HSPICE simulation of the output characteristics of 4-valued NMOS source-follower circuits. The dashed lines show the output characteristics without the present invention, and the solid lines show the output characteristics with the present invention. It is clearly seen that the present invention drastically accelerates the source-follower readout.

(Embodiment 2)

If the body of transistor N3 in Embodiment 1 were connected to the data line, then the junction capacitance of the well containing N3 would be added as a parasitic capacitance to the data line. Since N3 should be designed to be very large, the parasitic junction capacitance of its well would also be very large.

Figure 5:
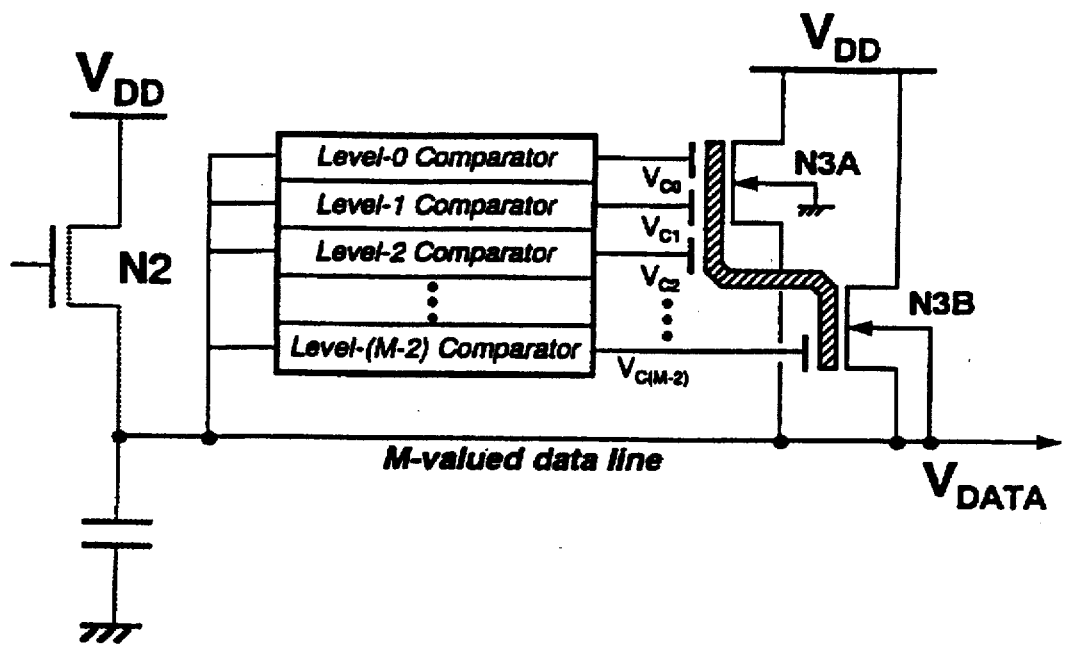
FIG. 5 is a conceptual diagram showing the circuit of Embodiment 2.

To offset this disadvantage, the circuit in FIG. 5 is presented in this embodiment. This circuit is similar to that of Embodiment 1, except that N3 is divided into two transistors connected in parallel: N3A (whose body is biased to $V_{SS}$) and N3B (whose body is connected to the data line). In this manner, N3A, with no large parasitic junction capacitance, aids in pulling up $V_{DATA}$, and N3B will overcome the body effect of N2 and N3A. The ratio $(W/L)_{N3A}$: $(W/L)_{N3B}$ must be optimized for speed according to the device parameters.

In Embodiments 1 and 2, the invention is applied to speed up the voltage transition of the data line from an initial voltage to a higher voltage. This is because the data line is initially driven by a source follower consisting of a small NMOS transistor. For this reason, a large NMOS transistor was used to raise the data line. Conversely, if the data line is driven by a small PMOS source follower from a higher initial voltage to a lower voltage, then a large PMOS transistor should be used to speed up the process.

So far, the explanations have been provided for cases where the initial data line transient is caused by a MOS source-follower circuit. However, this invention is not limited to these cases. The data line can be initially driven by a resistor directly connected to a voltage source or by an emitter-follower circuit of a bipolar transistor, for example. In any case, this invention is applicable to speed up a transient by using sensing and boosting circuitry consisting of MOS source followers.

(Embodiment 3)

Figure 6:
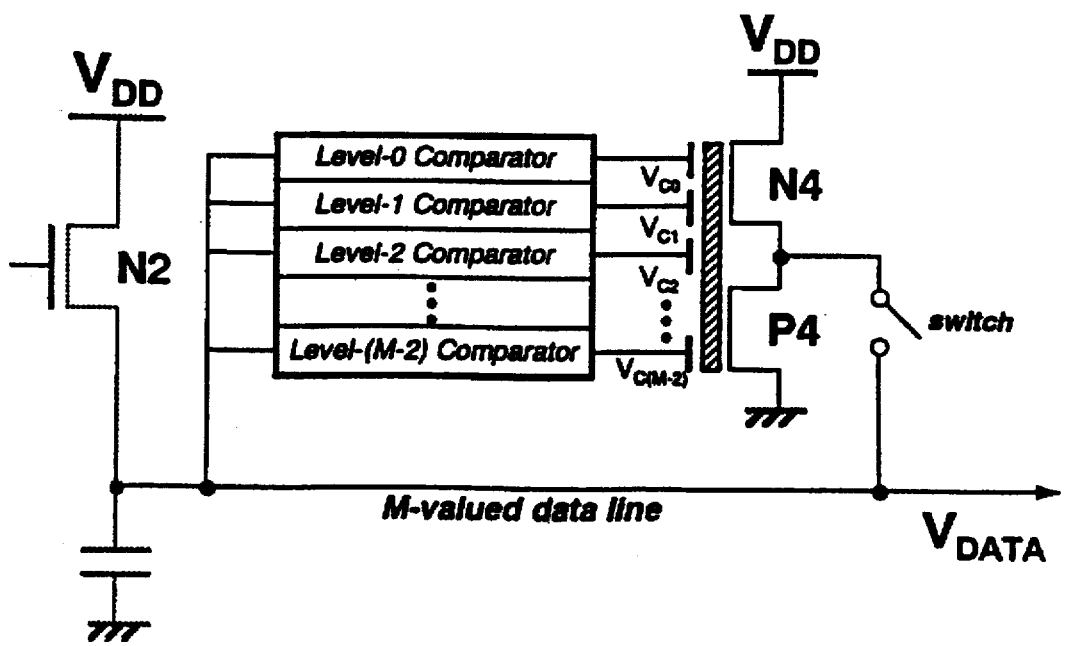
FIG. 6 is a conceptual diagram showing the circuit of Embodiment 3.

In the previous embodiments, N3 can be replaced by a CMOS source-follower circuit, consisting of an NMOS (N4) and a PMOS (P4), as depicted in FIG. 6. Unlike N3, however, the output of the CMOS source-follower circuit is constrained to equal $\Phi_{F1}$; any current flowing from N2 would find a conducting path to $V_{SS}$ through P4. Therefore, a switch must be added between the CMOS source-follower output and the data line. The switch must be off initially to allow N2 to charge up the data line, and the switch must be on whenever the CMOS source follower is charging up the data line; the switch must be turned off again whenever the comparators are detecting whether or not current is still flowing from N2.

(Embodiment 4)

Figure 7:
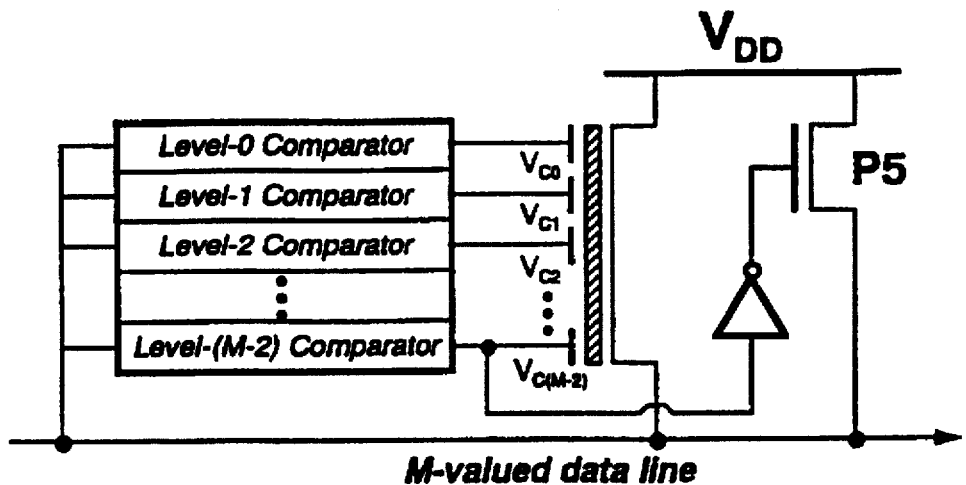
FIG. 7 is a conceptual diagram showing the circuit of Embodiment 4.

If the body effect observed in the NMOS source follower of Embodiments 1 and 2 are appreciable, then the data line cannot fully reach the maximum value of $V_{DD}$. The circuit shown in FIG. 7 overcomes this problem by using a PMOS transistor (P5) as a switch between $V_{DD}$ and the data line; the output of the Level-(M-1) comparator is connected to the input of an inverter, and the output of said inverter is connected to the gate electrode of the PMOS. Therefore, this PMOS turns on when the highest level is sensed, i.e., when the Level-(M-1) comparator turns on. In this manner, the data line is able to rise to the maximum value of $V_{DD}$ when reading out the highest voltage level, thus giving the source follower an effectively unity gain.

Similarly, if a PMOS source follower is used in Embodiments 1 and 2, then the data line cannot fully reach the minimum value of $V_{SS}$. This problem can be similarly solved by using an NMOS transistor as a switch between the data line and ground; the NMOS turns on when the lowest level is sensed.

Furthermore, if the CMOS source follower of Embodiment 3 is used, then the loss of gain resulting from the body effect is compensated by using a PMOS switch between $V_{DD}$ and the data line, and an NMOS switch between $V_{SS}$ and the data line. The PMOS turns on when the highest voltage level is sensed, and the NMOS turns on when the lowest level is sensed.

(Embodiment 5)

Figure 8:
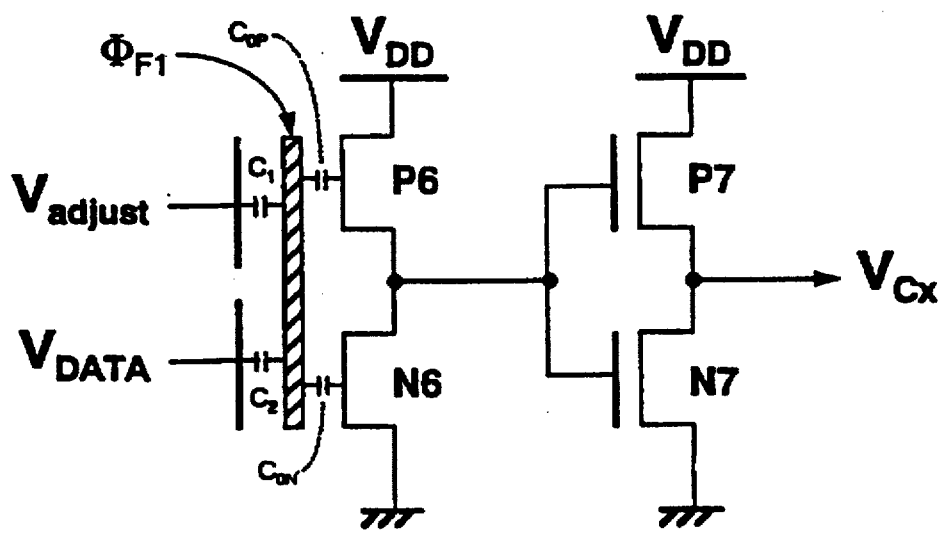
FIG. 8 is a conceptual diagram showing the circuit of Embodiment 5.

The fifth embodiment of the present invention is shown in FIG. 8. This circuit depicts the Level-x comparator used in Embodiments 1-4. The comparator has two inputs, $V_{adjust}$ and $V_{DATA}$, which are capacitively coupled to a floating gate electrode. Said floating gate is the input gate of a first CMOS inverter. This inverter contains a PMOS (P6), and an NMOS (N6). The output of said first inverter is connected to a second CMOS inverter consisting of P7 and N7. The output of said second CMOS inverter serves as the output of the Level-x comparator, $V_{Cx}$. Let the inversion threshold of both inverters be $$V_{INV} = \frac{(V_{DD} - V_{SS})}{2} + V_{SS}. \quad (6)$$

The coupling capacitances of $V_{adjust}$ and $V_{DATA}$ are $C_1$ and $C_2$, respectively. Then the potential $\Phi_{F2}$ of the floating gate is $$\Phi_{F2} = \frac{C_1 V_{adjust} + C_2 V_{DATA}}{C_1 + C_2 + C_{OP} + C_{ON}} \approx \frac{C_1 V_{adjust} + C_2 V_{DATA}}{C_1 + C_2}, \quad (7)$$

if $C_{OP}, C_{ON} \ll C_1, C_2$.

Here, $C_{OP}$ and $C_{ON}$ are the coupling capacitances from the floating gate to the substrates of P5 and N5.

Since the purpose of this circuit is to detect when $V_{DATA}$ surpasses $V_{Level\ x}$, it must operate under the following conditions:

If $V_{DATA} > V_{Level\ x}$ then $\Phi_{F2} > V_{INV}$; therefore $V_{Cx} = V_{DD}$.

If $V_{DATA} < V_{Level\ x}$ then $\Phi_{F2} < V_{INV}$; therefore $V_{Cx} = V_{SS}$.

These conditions are achieved by adjusting the coupling capacitance ratio $C_1:C_2$ or the input voltage $V_{adjust}$.

(Embodiment 6)

Figure 9:
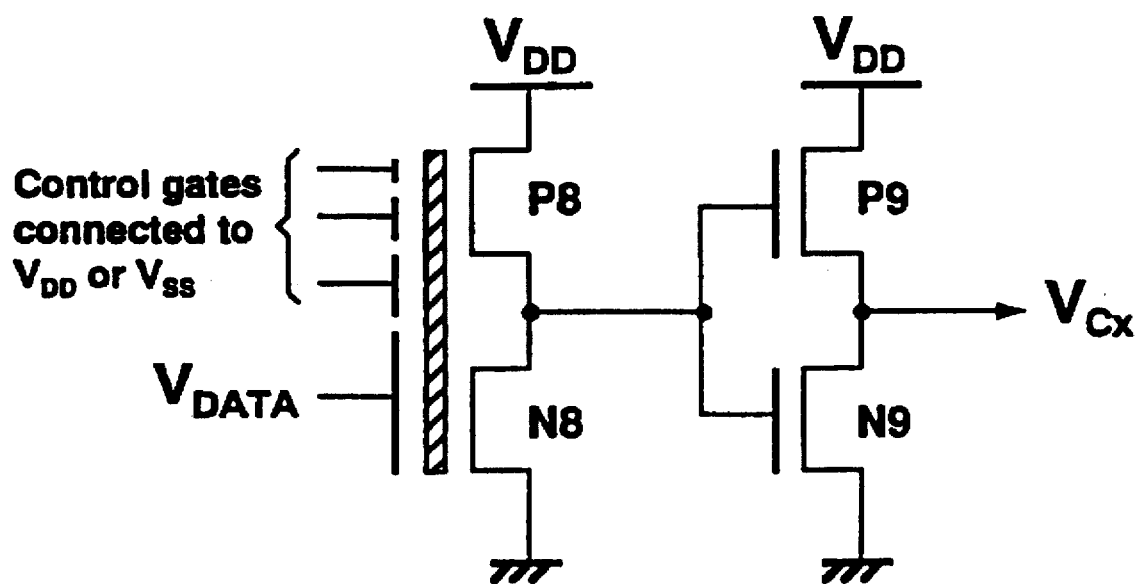
FIG. 9 is a conceptual diagram showing the circuit of Embodiment 6.

In Embodiment 5, the bias voltage of $V_{adjust}$ was directly supplied to an input gate in order to control the effective inversion threshold as seen from $V_{DATA}$. However, the same effect may be achieved by breaking up control gate $C_1$ into multiple gates and connecting said gates to either $V_{DD}$ or $V_{SS}$, as shown in FIG. 9. In this manner, only two different power supplies are required.

(Embodiment 7)

In Embodiments 1 through 6, the floating gates are completely electrically isolated. However, it is possible that over time, some amount of charge could be injected into the floating gate. In order to reset the floating gate so that there is no net charge, a switch may be added between the floating gate and ground (or a voltage source which sets the initial condition). This switch is off when the circuit is in operation but turns on during a refresh cycle. For refresh operation, all input terminals capacitively coupled to the floating gate need to be grounded or set to appropriate initial potentials in order to guarantee the same initial condition. However, these potentials, as well as the floating gate's refresh potential, may be changed at each refresh cycle to any value.

INDUSTRIAL APPLICABILITY

By means of the present invention, it is possible to realize a source-follower circuit having a voltage gain equal to one, and to reduce the time necessary for the source follower to reach its full output voltage. Furthermore, the analog or multiple-valued output of a source follower can be easily converted into a binary-digital format by this invention.

This invention is especially suitable for multiple-valued memories which use a source-follower gain cell. In such an application, several memory cells are connected to one bitline. Since the bitline capacitance is large, it would take a very long time for one memory cell to raise the bitline voltage to the value stored in the cell. If the present invention is connected to the bitline, it would drastically accelerate the readout time of the memory cells. In this manner, the invention would serve as a sense amplifier for the memory cells. If the memory cells are dynamic, then this invention would also serve as refresh circuitry.

Additionally, this invention is not limited to readout of source-follower circuits. It can be applied in any system where a multiple-valued or analog data line is employed.

We claim:

1. A semiconductor memory device comprising at least an MOS transistor coupled to multiple-valued comparators, wherein a data line carries a multiple-valued or analog voltage signal which shows a transient rising from a lower initial voltage to a higher final voltage level, said data line is connected to the inputs of said multiple-valued comparators, the outputs of said comparators are capacitively coupled to a floating gate electrode, said floating gate electrode is the input gate of an NMOS source-follower circuit, and the output of said source-follower circuit is fedback to the data line.

2. A semiconductor memory device in accordance with claim 1, wherein the output of the comparator detecting the highest voltage level is also connected to an inverter, the output of said inverter is connected to the gate electrode of a PMOS transistor, the source electrode potential of said PMOS transistor is equal to the highest voltage level of the memory device, and the drain of said PMOS transistor is connected to the data line.

3. A semiconductor memory device in accordance with claim 1, wherein the comparators comprise one or more inputs which are capacitively coupled to a second floating gate electrode, one of said inputs is connected to the data line and the other inputs are connected to bias voltages for the purpose of controlling the second floating gate potential, said second floating gate electrode is the input gate of two inverters connected in series, and the output of the second inverter is the output of the comparator.

4. A semiconductor memory device in accordance with claim 1, wherein a switch is added between the floating gate electrode and ground potential, and said switch is turned off when the memory device is in operation but turned on during a refresh cycle.

5. A semiconductor memory device comprising at least an MOS transistor coupled to multiple-valued comparators, wherein a data line carries a multiple-valued or analog voltage signal which shows a transient falling from a higher initial voltage to a lower final voltage level, said data line is connected to the inputs of said multiple-valued comparators, the outputs of said comparators are capacitively coupled to a floating gate electrode, said floating gate electrode is the input gate of an PMOS source-follower circuit, and the output of said source-follower circuit is fedback to the data line.

6. A semiconductor memory device in accordance with claim 5, wherein the output of the comparator detecting the lowest voltage level is also connected to an inverter, the output of said inverter is connected to the gate electrode of an NMOS transistor, the source electrode potential of said NMOS transistor is equal to the lowest voltage level of the memory device, and the drain of said NMOS transistor is connected to the data line.

7. A semiconductor memory device in accordance with claim 5, wherein the comparators comprise one or more inputs which are capacitively coupled to a second floating gate electrode, one of said inputs is connected to the data line and the other inputs are connected to bias voltages for the purpose of controlling the second floating gate potential, said second floating gate electrode is the input gate of two inverters connected in series, and the output of the second inverter is the output of the comparator.

8. A semiconductor memory device in accordance with claim 5, wherein a switch is added between the floating gate electrode and ground potential, and said switch is turned off when the memory device is in operation but turned on during a refresh cycle.

9. A semiconductor memory device comprising plural n-channel MOS transistors and p-channel MOS transistors coupled to multiple-valued comparators, wherein a data line carries a multiple-valued or analog voltage signal which shows a transient rising or falling from an initial voltage to a final voltage level, said data line is connected to the inputs of said multiple-valued comparators, the outputs of said comparators are capacitively coupled to a floating gate electrode, said floating gate electrode is the input gate of an CMOS source-follower circuit, and a switch between the output of said source-follower circuit and the data line alternately connects and disconnects a feedback loop.

10. A semiconductor memory device in accordance with claim 9, wherein the output of the comparator detecting the highest voltage level is also connected to a first inverter, the output of said first inverter is connected to the gate electrode of a PMOS transistor, the source electrode potential of said PMOS transistor is equal to the highest voltage level of the memory device, the drain of said PMOS transistor is connected to the data line, and the output of the comparator detecting the lowest voltage level is also connected to a second inverter, the output of said second inverter is connected to the gate electrode of an NMOS transistor, the source electrode potential of said NMOS transistor is equal to the lowest voltage level of the memory device, and the drain of said NMOS transistor is connected to the data line.

11. A semiconductor memory device in accordance with claim 9, wherein the comparators comprise one or more inputs which are capacitively coupled to a second floating gate electrode, one of said inputs is connected to the data line and the other inputs are connected to bias voltages for the purpose of controlling the second floating gate potential, said second floating gate electrode is the input gate of two inverters connected in series, and the output of the second inverter is the output of the comparator.

12. A semiconductor memory device in accordance with claim 9, wherein a second switch is added between the floating gate electrode and ground potential, and said second switch is turned off when the memory device is in operation but turned on during a refresh cycle.

* * * * *